(12) United States Patent
Park

(10) Patent No.: US 8,183,895 B2
(45) Date of Patent: May 22, 2012

(54) CLOCK DIVIDING CIRCUIT

(75) Inventor: Bongil Park, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 5 days.

(21) Appl. No.: 12/697,794

(22) Filed: Feb. 1, 2010

(65) Prior Publication Data

US 2010/0225365 A1    Sep. 9, 2010

(30) Foreign Application Priority Data

Mar. 9, 2009    (KR) .................. 10-2009-0019948

(51) Int. Cl.
*H03B 19/00*    (2006.01)
(52) U.S. Cl. .................... 327/115; 327/113; 327/117
(58) Field of Classification Search .................. 327/115, 327/117, 118
See application file for complete search history.

(56) References Cited

U.S. PATENT DOCUMENTS

| | | | |
|---|---|---|---|
| 4,758,821 A * | 7/1988 | Nelson et al. ................. 341/157 |
| 5,084,868 A * | 1/1992 | Kelly et al. ................... 370/482 |
| 5,189,315 A * | 2/1993 | Akata ............................ 327/203 |
| 5,689,517 A | 11/1997 | Ruparel |
| 5,815,423 A * | 9/1998 | Kim ............................... 708/655 |
| 6,035,182 A * | 3/2000 | Shurboff ....................... 455/216 |
| 6,271,702 B1 * | 8/2001 | Stansell ........................ 327/295 |
| 6,501,815 B1 * | 12/2002 | Stansell ........................... 377/47 |
| 6,570,418 B2 * | 5/2003 | Uehara .......................... 327/141 |
| 2002/0131190 A1 * | 9/2002 | Groo ................................ 360/51 |

FOREIGN PATENT DOCUMENTS

| JP | 05-206791 A | 8/1993 |
|---|---|---|
| JP | 2001-119292 A | 4/2001 |
| JP | 2008-005446 A | 1/2008 |

\* cited by examiner

*Primary Examiner* — Ryan Jager
(74) *Attorney, Agent, or Firm* — Sughrue Mion, PLLC

(57) ABSTRACT

A clock dividing circuit includes a control logic unit and a flip-flop. The control logic unit outputs an enable signal and a data signal according to a clock signal and a division ratio. The flip-flop outputs a divided clock signal based on the clock signal, the enable signal and the data signal. The clock signal can be directly outputted as the divided clock signal through the flip-flop.

7 Claims, 6 Drawing Sheets

CLOCK DIVIDING CIRCUIT

CROSS-REFERENCE TO RELATED APPLICATIONS

This U.S. non-provisional patent application claims priority under 35 U.S.C. §119 to Korean Patent Application No. 10-2009-0019948, filed on Mar. 9, 2009, the entire contents of which are hereby incorporated by reference.

SUMMARY

The present exemplary embodiments relate to semiconductor integrated circuits (ICs), and more particularly, to clock dividing circuits.

Semiconductor ICs operating in synchronization with a clock signal need clock signals of various frequencies. Instead of receiving all of the clock signals of various frequencies from external devices, a clock dividing circuit is used to divide a clock signal received from an external device, thereby generating a clock signal of a desired frequency.

The structure of a clock dividing circuit to generate a plurality of divided clock signals with different frequencies is complicated, thus increasing the area occupied by the circuit. Also, a clock dividing circuit with complicated circuit structure has a low response speed, thus impeding the implementation of high-speed circuits.

Exemplary embodiments of the inventive concept provide clock dividing circuits with simplified circuit structure.

According to one aspect of the present inventive concept, a clock dividing circuit includes: a control logic unit which receives a clock signal and outputs an enable signal and a data signal in response to a division ratio; and a flip-flop which generates a divided clock signal in response to the clock signal, the enable signal and data signal. The flip-flop may include a first inverter which inverts the data signal at a first edge of the clock signal; a first latch which inverts the output signal of the first inverter and latches the output signal of the first inverter at a second edge of the clock signal; a second inverter which inverts the output of the first latch at the second edge of the clock signal; and a second latch which inverts the output signal of the second inverter to output the divided clock signal and latches the output signal of the second inverter in response to the enable signal and the first edge of the clock signal.

The first latch may include: a third inverter connected between the first inverter and the second inverter; and a fourth inverter connected between the second inverter and the first inverter which inverts the output signal of the second inverter at the second edge of the clock signal and transfers the result to the third inverter.

The second latch may include: a fifth inverter which inverts the output signal of the second inverter and outputs the divided clock signal; a logic gate which receives the divided clock signal and the enable signal; and a sixth inverter which inverts the output signal of the logic gate in response to the first edge of the clock signal to transfers the result to the fifth inverter.

The control logic unit may include a counter which outputs a count value in response to the first edge of the clock signal and has a maximum count value corresponding to the division ratio.

The control logic unit may output the enable signal and the data signal in response to the division ratio and the count value of the counter.

When the division ratio is an even number, the control logic unit may set the enable signal to a high level; and when the division ratio is an odd number, the control logic unit may set the enable signal according to the relationship between the count value and the division ratio.

The control logic unit may set the data signal to a high level when the division ratio is 0.

When the division ratio is an even number, the control logic unit may set the data signal to a high level if the count value<(the division ratio−1)/2 or the count value=(the division ratio−1) and may set the data signal to a low level if not the count value<(the division ratio−1)/2 and the count value=(the division ratio−1).

When the division ratio is an odd number, the control logic unit may set the data signal to a high level if (the count value+1)<(the division ratio−1)/2 or the count value=(the division ratio−1) and may set the data signal to a low level if not (the count value+1)<(the division ratio−1)/2 and the count value=(the division ratio−1).

Further, first edge of the clock signal may be a falling edge and the second edge of the clock signal may be a rising edge.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EXEMPLARY EMBODIMENTS

Exemplary embodiments of the inventive concept will be described below in more detail with reference to the accompanying drawings. The inventive concept may, however, be embodied in different forms and should not be construed as limited to the exemplary embodiments set forth herein. Rather, these exemplary embodiments are provided so that this disclosure will be thorough and complete, and will convey the inventive concept to those skilled in the art.

Hereinafter, exemplary embodiments of the inventive concept will be described in detail with reference to the accompanying drawings.

Figure 1:
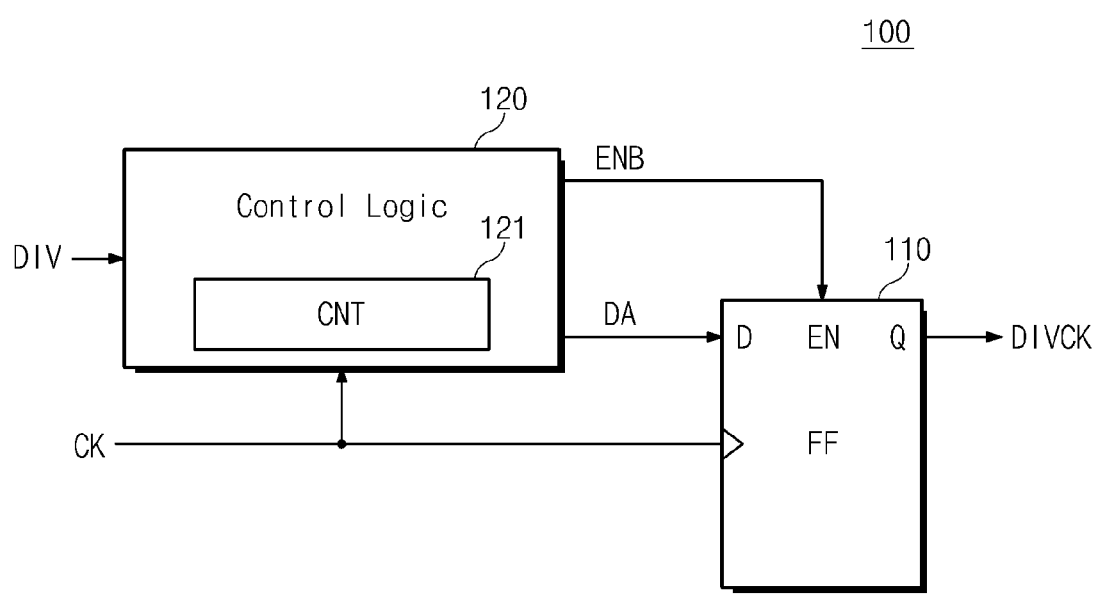
FIG. 1 is a diagram illustrating a clock dividing circuit according to an exemplary embodiment of the inventive concept.

FIG. 1 is a diagram illustrating a clock dividing circuit according to an exemplary embodiment of the inventive concept.

Referring to FIG. 1, a clock dividing circuit 100 includes a flip-flop 110 and a control logic unit 120. The control logic unit 120 receives a clock signal CK and outputs an enable signal ENB and a data signal DA in response to or based on a division ratio DIV. The control logic unit 120 includes a counter 121 that outputs a count value CNT. The control logic unit 120 receives a clock signal CK and a signal representing a division ratioDIV and outputs an enable signal ENB and a data signal DA. The flip-flop 110 outputs a divided clock signal DIVCK in response to or based on the clock signal CK, and the enable signal ENB and the data signal DA received from the control logic unit 120.

Figure 2:
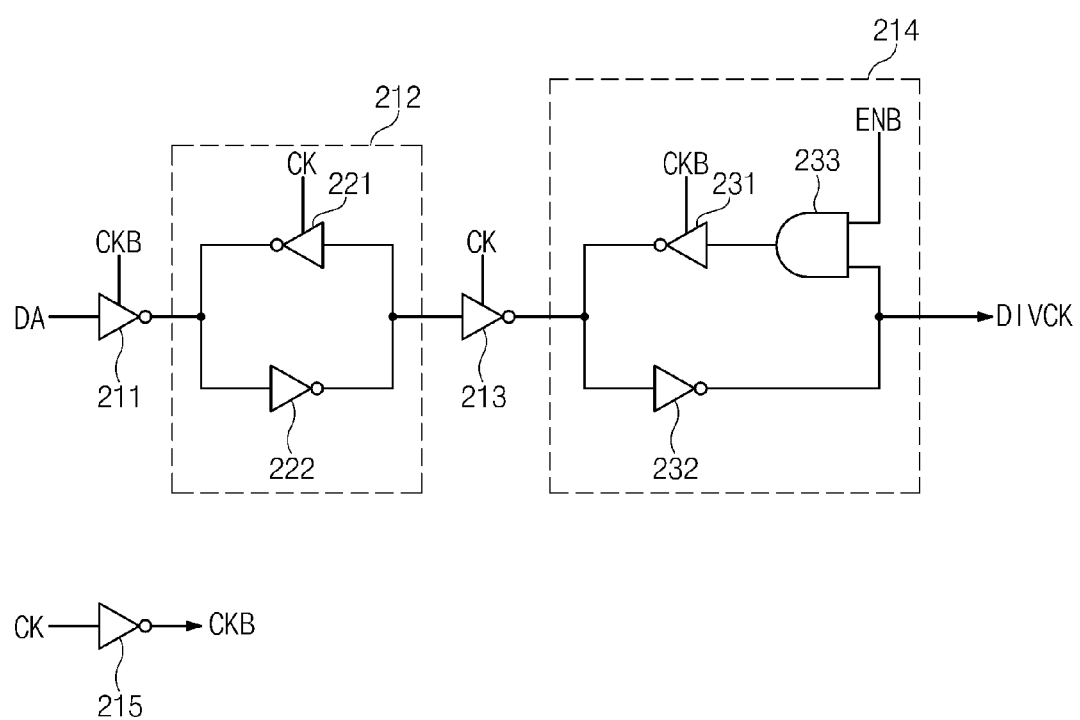
FIG. 2 is a diagram illustrating an example of a detailed structure of a flip-flop illustrated in FIG. 1.

FIG. 2 is a diagram illustrating an example of a detailed structure of the flip-flop 110 illustrated in FIG. 1.

Referring to FIG. 2, the flip-flop 110 includes inverters 211, 213 and 215 and latches 212 and 214. The inverter 215 inverts the clock signal CK to output an inverted clock signal CKB. The inverter 211 receives the data signal DA from the control logic unit 120, and inverts the data signal DA in response to the inverted clock signal CKB. The latch 212 includes inverters 221 and 222. The inverter 222 is connected between the inverters 211 and 213, and the inverter 221 is connected between the inverters 213 and 211. In response to the clock signal CK, the inverter 221 inverts the output of the inverter 222 to transfer the result to the input of the inverter 222. That is, when the clock signal CK has a high level, the latch 212 latches the output of the inverter 211 to transfer the result to the inverter 213.

In response to the clock signal CK, the inverter 213 inverts the output of the latch 212 to output the result to the latch 214. The latch 214 includes inverters 231 and 232 and an AND gate 233. The inverter 232 inverts the output of the inverter 213 to output the divided clock signal DIVCK. The AND gate 233 receives the divided clock signal DIVCK and the enable signal ENB. In response to or based on the inverted clock signal CKB, the inverter 231 inverts the output of the AND gate 233 to transfer the result to the input of the inverter 232. The latch 214 latches the output of the inverter 213 while the inverted clock signal CKB has a high level and the enable signal ENB has a high level.

In this manner, while the enable signal ENB has a low level, the flip-flop 110 outputs the data signal DA as the divided clock signal DIVCK when the clock signal CK has a high level; and sets the divided clock signal DIVCK to a low level when the clock signal CK has a low level. When the enable signal ENB has a high level, the flip-flop 110 outputs the data signal DA as the divided clock signal DIVCK in response to the clock signal CK.

Figure 3:
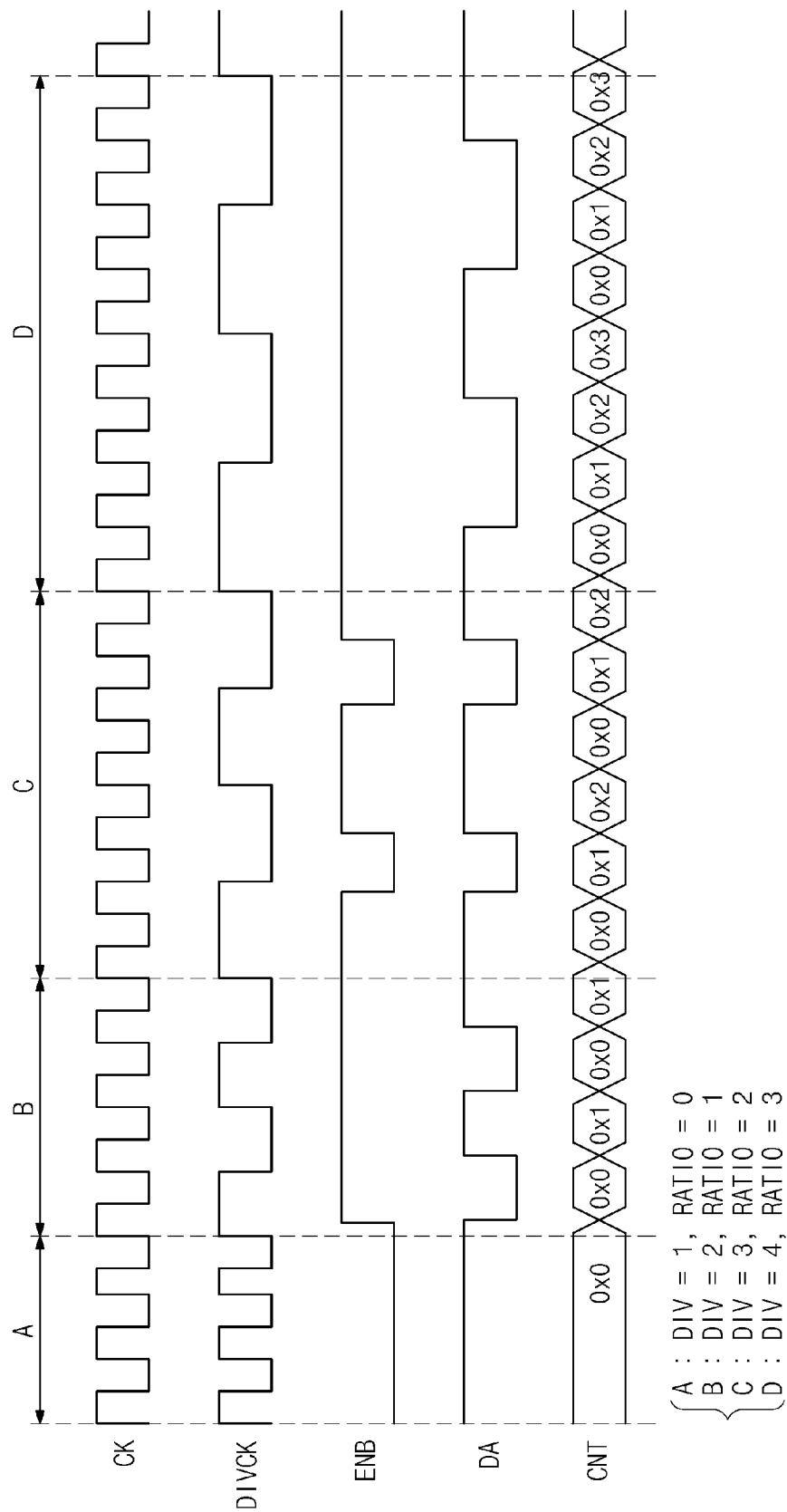
FIG. 3 is a timing diagram illustrating an example of a data signal, an enable signal and a divided clock signal generated by the clock dividing circuit illustrated in FIG. 1.

FIG. 3 is a timing diagram illustrating an example of the data signal DA, the enable signal ENB and the divided clock signal DIVCK generated by the clock dividing circuit 100 illustrated in FIG. 1.

Referring to FIG. 3, the clock dividing circuit 100 may output divided clock signals DIVCK by dividing the clock signal CK at a first division ratio A, a second division ratio B, a third division ratio C and a fourth division ratio D according to the enable signal ENB and the data signal DA generated by the control logic unit 120. The frequency of the divided clock signal DIVCK outputted from the clock dividing circuit 100 may vary according to the division ratio DIV inputted to the control logic unit 120.

Figure 4:
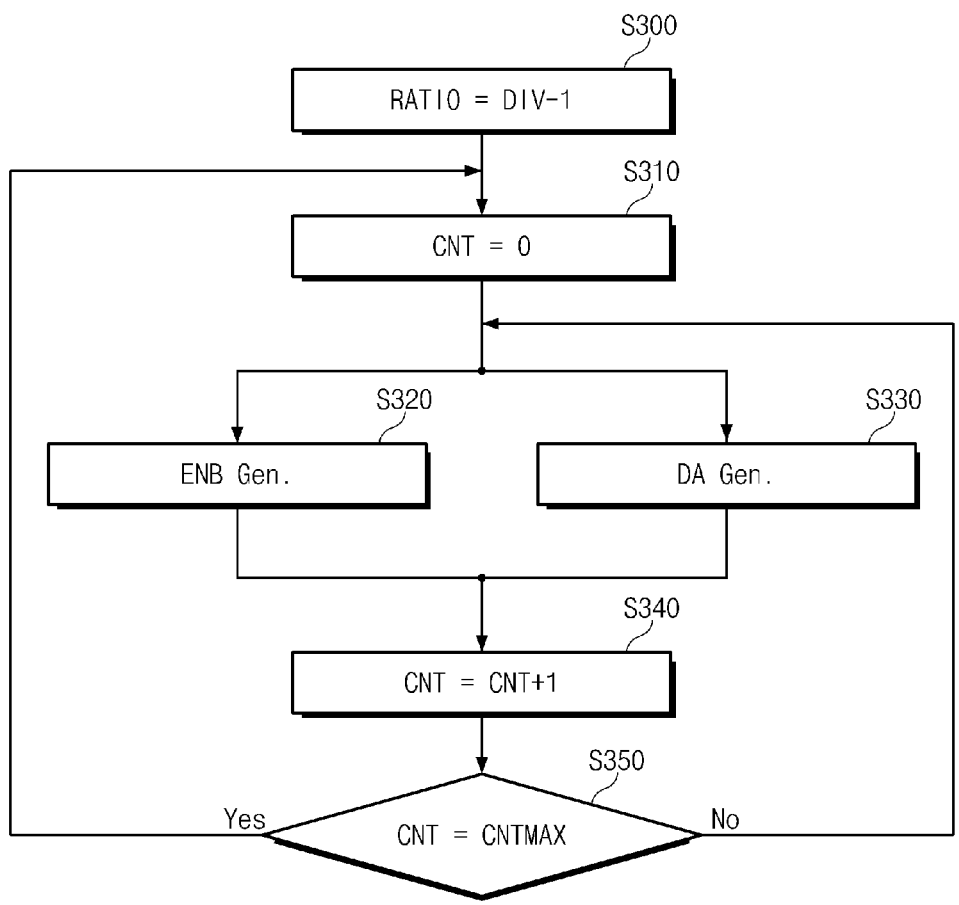
FIG. 4 is a flow chart illustrating an operation of a control logic unit according to an exemplary embodiment of the inventive concept.

FIG. 4 is a flow chart illustrating an operation of the control logic unit 120. The control logic unit 120 may be configured as a logic gate circuit for performing operational steps illustrated in FIG. 4.

Referring to FIG. 4, the control logic unit 120 sets a division value RATIO to (the division ratio DIV−1) (S300). The count value CNT of the counter 121 in the control logic unit 120 is initialized to 0 (S310). The control logic unit 120 performs an enable signal (ENB) generation operation (S320) and a data signal (DA) generation operation (S330) in parallel. The counter 121 outputs a count value increasing by an increment of 1 in synchronization with the clock signal CK (S340). The counter 121 sets the maximum count value CNTMX according to the division ratio DIV. For example, if the division ratio DIV is 1, the maximum count value CNTMX of the counter 121 is 1. If the division ratio DIV is 2, the maximum count value CNTMX is 2. If the division ratio DIV is 3, the maximum count value CNTMX is 3.

The control logic unit 120 determines whether the count value CNT reaches the maximum count value CNTMX (S350). If the count value CNT reaches the maximum count value CNTMX, the control logic unit 120 returns to step 310 to initialize the count value CNT to 0. On the other hand, if the count value CNT does not reach the maximum count value CNTMX, the control logic unit 120 returns to steps 320 and 330 to repeat an enable signal (ENB) generation operation and a data signal (DA) generation operation according to the count value CNT and the division value RATIO.

The control logic unit 120 stops the enable signal (ENB) generation operation and the data signal (DA) generation operation in response to a specific signal such as a rest signal, or if the input of the clock signal CK stops.

Figure 5:
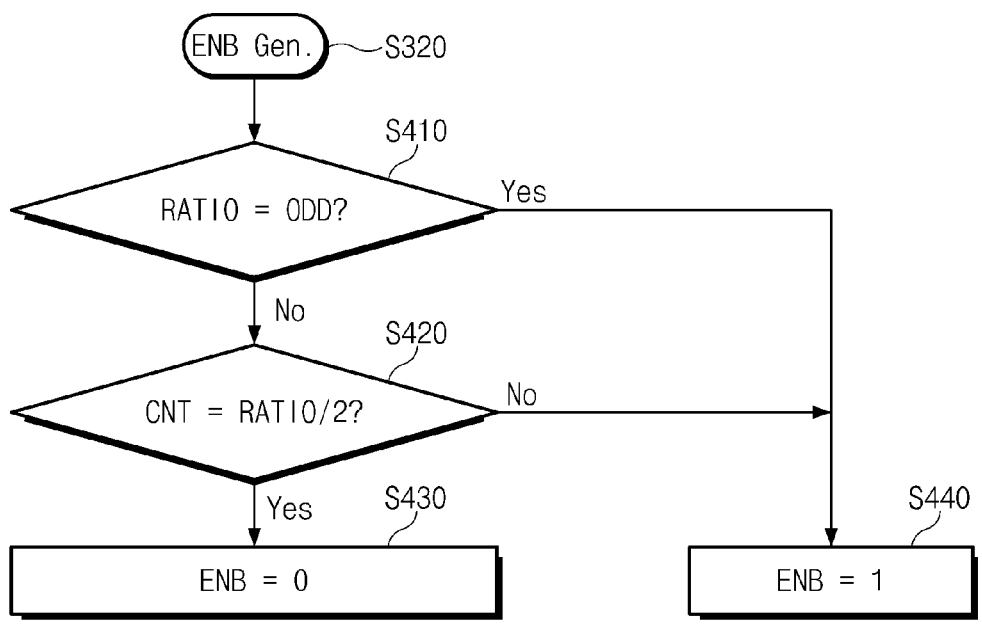
FIG. 5 is a flow chart illustrating an enable signal generation operation of the control logic unit illustrated in FIGS. 4.

FIG. 5 is a flow chart illustrating the enable signal (ENB) generation operation of the control logic unit 120 illustrated in FIG. 4.

Referring to FIG. 5, the control logic unit 120 determines whether the division value RATIO is an odd number (i.e., if the division ratio DIV is an even number) (S410). If the division value RATIO is an odd number, the control logic unit 120 sets the enable signal ENB to a high level (i.e., a logic level '1') (S440). The count value CNT and RATIO/2 are compared to shift the level of the divided clock signal DIVCK at a clock cycle corresponding to 1/2 of the division ratio DIV. On the other hand, if the division value RATIO is an even number, the control logic unit 120 determines whether the count value CNT is equal to RATIO/2 (S420). If the count value CNT is equal to RATIO/2, the control logic unit 120 sets the enable signal ENB to a low level (i.e., a logic level '0') (S430). On the other hand, if the count value CNT is different from RATIO/2, the control logic unit 120 sets the enable signal ENB to a high level (S440).

According to the above exemplary embodiment of the inventive concept, when the division ratio DIV is 1, because the condition of CNT=RATIO/2 is always satisfied, the control logic unit 120 outputs the low-level enable signal ENB. If the division ratio DIV is an even number (i.e., if the division value RATIO is an odd number), the enable signal ENB is set to a high level. Also, if the division ratio DIV is an odd number (i.e., if the division value RATIO is an even number), the enable signal ENB is set according to the count value CNT. The enable signal ENB is set to a low level at the (RATIO/2)$^{th}$ clock cycle of the clock signal CK, and the enable signal ENB is set to a high level at the other clock cycles of the clock signal CK.

Figure 6:
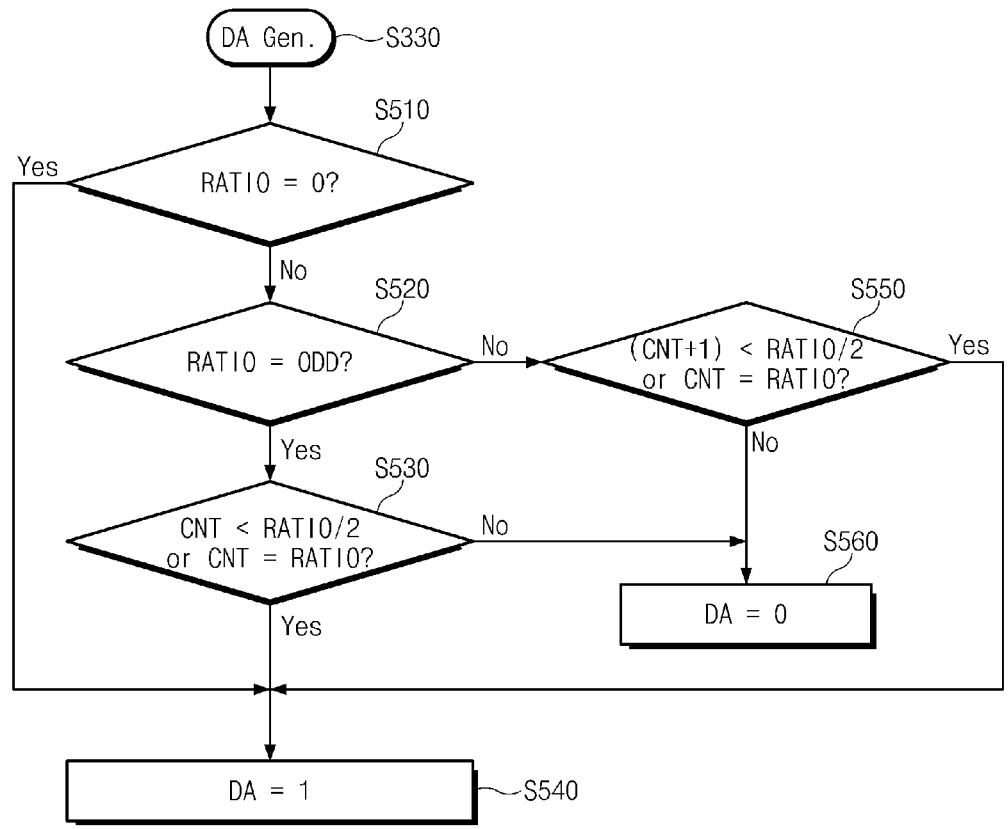
FIG. 6 is a flow chart illustrating a data signal generation operation of the control logic unit illustrated in FIG. 4.

FIG. 6 is a flow chart illustrating the data signal (DA) generation operation of the control logic unit 120 illustrated in FIG. 4.

Referring to FIG. 6, the control logic unit 120 determines whether the division value RATIO is 0 (i.e., whether the division ratio DIV is 1) (S510). If the division value RATIO is 0, the control logic unit 120 sets the data signal DA to a high level (S540). On the other hand, if the division value RATIO is not 0, the control logic unit 120 proceeds determines whether the division value RATIO is an odd number S520). If the division value RATIO is an odd number, the control logic unit 120 compares the count value CNT and the division value RATIO (S530). If CNT<RATIO/2 or CNT=RATIO, the control logic unit 120 sets the data signal DA to a high level (S540). On the other hand, if the two conditions of CNT<RATIO/2 and CNT=RATIO are not satisfied, the control logic unit 120 sets the data signal DA to a low level (S560).

On the other hand, if the division value RATIO is an even number, the control logic unit 120 determines whether (CNT+1)<RATIO/2 or CNT=RATIO is satisfied (S550). If (CNT+1)<RATIO/2 or CNT=RATIO is satisfied, the control logic unit 120 sets the data signal DA to a high level (S540). On the other hand, if the two conditions of (CNT+1)<RATIO/2 and CNT=RATIO) are not satisfied, the control logic unit 120 sets the data signal DA to a low level (S560).

According to the above exemplary embodiment of the inventive concept, the control logic unit 120 outputs the low-level enable signal ENB and the high-level data signal DA when the division ratio DIV is 1. Therefore, in synchronization with the clock signal CK, the flip-flop 110 outputs the divided clock signal DIVCK having the same frequency as the clock signal CK.

If the division ratio DIV is an even number, the control logic unit 120 outputs the high-level enable signal ENG. Also, the control logic unit 120 outputs the data signal DA that has a high level under the condition of (CNT+1)<RATIO/2 or CNT=RATIO and has a low level under the other conditions. Therefore, the flip-flop 110 outputs the data signal DA as the divided clock signal DIVCK in synchronization with the clock signal CK. The clock dividing circuit 100 outputs the divided clock signal DIVCK whose level is shifted at a rising edge of the clock cycle corresponding to the division ratio DIV when the division ratio DIV is an even number.

If the division ratio DIV is an odd number, the control logic unit 120 outputs the enable signal ENB having a low level when the count value CNT is equal to RATIO/2. As illustrated in FIG. 2, if the enable signal ENB has a low level, the divided clock signal DIVCK is set to a low level at a falling edge of the clock signal CKB. The clock dividing circuit 100 outputs the divided clock signal DIVCK that shifts from a high level to a low level at a falling edge of the clock cycle corresponding to the division ratio DIV when the division ratio DIV is an odd number. If the data signal DA has a high level, the output of the inverter 231 may be discharged through the inverter 213 in response to the high-level clock signal CK after the inverter 231 outputs a high-level signal in response to the high-level inverted clock signal CKB. Therefore, the data signal DA maintains a low level.

According to the inventive concept described above, the control logic unit 120 outputs the enable signal ENB and the data signal DA according to the clock signal CK and the division ratio DIV. The clock signal CK can be directly outputted as the divided clock signal DIVCK through the flip-flop 110. Therefore, even when the division ratio DIV inputted to the clock dividing circuit 100 changes variously, the response speed according to the division ratio is constant because the path of output of the clock signal CK as the divided clock signal DIVCK is constant. Also, the clock dividing circuit 100 can be implemented to have a simplified circuit structure. Therefore, the area of a semiconductor IC occupied by the circuit can be minimized and the operation speed can be increased.

As described above, the use of the inventive concept makes it possible to implement a clock dividing circuit that has a simplified circuit structure and generates clock signals with various frequencies. Moreover, the clock signal is outputted as a divided clock signal through only one flip-flop, thus simplifying the analysis of the transfer path of the clock signal in designing a semiconductor IC.

The above-disclosed subject matter is to be considered illustrative and not restrictive, and the appended claims are intended to cover all such modifications, enhancements, and other exemplary embodiments, which fall within the true spirit and scope of the inventive concept. Thus, the scope of the inventive concept is determined by the broadest interpretation of the following claims and their equivalents, and shall not be restricted or limited by the foregoing detailed description.

What is claimed is:

1. A clock dividing circuit comprising:
   a control logic unit which receives a clock signal and outputs an enable signal and a data signal based on a division ratio; and
   a flip-flop which generates a divided clock signal based on the clock signal, the enable signal and the data signal, the flip-flop comprising:
   a first inverter which inverts the data signal at a first edge of the clock signal;
   a first latch which inverts an output signal of the first inverter and latches the output signal of the first inverter at a second edge of the clock signal;
   a second inverter which inverts an output signal of the first latch at the second edge of the clock signal; and
   a second latch which inverts an output signal of the second inverter to output the divided clock signal and latches the output signal of the second inverter based on the enable signal and the first edge of the clock signal,
   wherein the control logic unit comprises a counter which outputs a count value based on the first edge of the clock signal and has a maximum count value corresponding to the division ratio,
   wherein when the division ratio is an even number, the control logic unit sets the enable signal to a high level; and
   when the division ratio is an odd number, the control logic unit sets the enable signal according to a relationship between the count value and the division ratio.

2. A clock dividing circuit, comprising:
   a control logic unit which receives a clock signal and outputs an enable signal and a data signal based on a division ratio; and
   a flip-flop which generates a divided clock signal based on the clock signal, the enable signal and the data signal, the flip-flop comprising:
   a first inverter which inverts the data signal at a first edge of the clock signal;
   a first latch which inverts an output signal of the first inverter and latches the output signal of the first inverter at a second edge of the clock signal;
   a second inverter which inverts an output signal of the first latch at the second edge of the clock signal; and
   a second latch which inverts an output signal of the second inverter to output the divided clock signal and latches the output signal of the second inverter based on the enable signal and the first edge of the clock signal,
   wherein the control logic unit comprises a counter which outputs a count value based on the first edge of the clock signal and has a maximum count value corresponding to the division ratio, and
   wherein the control logic unit sets the data signal to a high level when the division ratio is 0.

3. A clock dividing circuit, comprising:
   a control logic unit which receives a clock signal and outputs an enable signal and a data signal based on a division ratio; and a flip-flop which generates a divided clock signal based on the clock signal, the enable signal and the data signal, the flip-flop comprising:
  a first inverter which inverts the data signal at a first edge of the clock signal;
  a first latch which inverts an output signal of the first inverter and latches the output signal of the first inverter at a second edge of the clock signal;
  a second inverter which inverts an output signal of the first latch at the second edge of the clock signal; and
  a second latch which inverts an output signal of the second inverter to output the divided clock signal and latches the output signal of the second inverter based on the enable signal and the first edge of the clock signal,
wherein the control logic unit comprises a counter which outputs a count value based on the first edge of the clock signal and has a maximum count value corresponding to the division ratio, and
wherein when the division ratio is an even number, the control logic unit sets the data signal to a high level if the count value<(the division ratio−1)/2 or the count value=(the division ratio−1) and sets the data signal to a low level if not the count value<(the division ratio−1)/2 and the count value=(the division ratio−1).

4. A clock dividing circuit, comprising:
a control logic unit which receives a clock signal and outputs an enable signal and a data signal based on a division ratio; and
a flip-flop which generates a divided clock signal based on the clock signal, the enable signal and the data signal, the flip-flop comprising:
  a first inverter which inverts the data signal at a first edge of the clock signal;
  a first latch which inverts an output signal of the first inverter and latches the output signal of the first inverter at a second edge of the clock signal;
  a second inverter which inverts an output signal of the first latch at the second edge of the clock signal; and
  a second latch which inverts an output signal of the second inverter to output the divided clock signal and latches the output signal of the second inverter based on the enable signal and the first edge of the clock signal,
wherein the control logic unit comprises a counter which outputs a count value based on the first edge of the clock signal and has a maximum count value corresponding to the division ratio, and
wherein when the division ratio is an odd number, the control logic unit sets the data signal to a high level if (the count value+1)<(the division ratio−1)/2 or the count value=(the division ratio−1) and sets the data signal to a low level if not (the count value+1)<(the division ratio−1)/2 and the count value=(the division ratio−1).

5. A circuit for generating a variable clock signal, the circuit comprising:
a control logic unit; and
a flip-flop,
wherein the control logic unit inputs a clock signal and a signal representing a division ratio, and outputs an enable signal and a data signal,
wherein the flip-flop inputs the clock signal, the enable signal, and the data signal, and outputs the variable clock signal,
wherein the variable clock signal is determined by dividing the input clock signal by the division ratio,
wherein the control logic unit comprises a counter which outputs a count value based on a first edge of the clock signal and has a maximum count value corresponding to the division ratio, and
wherein when the division ratio is an even number, the control logic unit sets the enable signal to a high level; and
when the division ratio is an odd number, the control logic unit sets the enable signal according to a relationship between the count value and the division ratio.

6. The circuit of claim 5, wherein the clock signal is divided by the division ratio according to the enable signal and the data signal.

7. The circuit of claim 5, wherein a frequency of the variable clock signal varies according to the division ratio.

* * * * *